United States Patent
Moser et al.

(10) Patent No.: US 10,714,207 B2
(45) Date of Patent: Jul. 14, 2020

(54) SCANNABLE-LATCH RANDOM ACCESS MEMORY

(71) Applicant: BAE SYSTEMS INFORMATION AND ELECTRONIC SYSTEMS INTEGRATION INC., Nashua, NH (US)

(72) Inventors: David D Moser, Haymarket, VA (US); Michael J. Frack, Reva, VA (US); Jason F. Ross, Haymarket, VA (US); Kevin Linger, Arlington, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/146,650

(22) Filed: Sep. 28, 2018

(65) Prior Publication Data

US 2020/0105360 A1  Apr. 2, 2020

(51) Int. Cl.
  *G11C 8/00* (2006.01)
  *G11C 29/32* (2006.01)
  *G11C 7/22* (2006.01)
  *G11C 7/10* (2006.01)

(52) U.S. Cl.
  CPC .............. *G11C 29/32* (2013.01); *G11C 7/106* (2013.01); *G11C 7/1087* (2013.01); *G11C 7/222* (2013.01); *G11C 2029/3202* (2013.01)

(58) Field of Classification Search
  CPC ..................................................... G11C 7/1075
  USPC ..................................................... 365/230.05
  See application file for complete search history.

(56) References Cited

U.S. PATENT DOCUMENTS

| | | | | |
|---|---|---|---|---|
| 7,843,218 B1 * | 11/2010 | Ramaraju | ...... | G01R 31/318541 326/38 |
| 2018/0096648 A1 * | 4/2018 | Kurokawa | ........... | G09G 3/2096 |

* cited by examiner

*Primary Examiner* — Hoai V Ho
(74) *Attorney, Agent, or Firm* — Antony P. Ng; Russell Ng PLLC; Scott J. Asmus

(57) ABSTRACT

A scannable-latch random access memory (SLRAM) is disclosed. The SLRAM includes two rows of memory cells. The SLRAM includes a functional data input, a scan data input, a first and second functional data outputs, a scan data output, and a scan enable. The functional data input is connected to a first memory cell in a first and second rows of memory cells. The scan data input is connected to the first memory cell in the first or second row of memory cells. The first and second functional data outputs are connected to a last memory cell in the first and second row of memory cells, respectively. The scan data output is connected to the last memory cell in the first or second row of memory cells. The scan enable allows data to be output from the scan data output or the first and second functional data outputs.

10 Claims, 3 Drawing Sheets

SCANNABLE-LATCH RANDOM ACCESS MEMORY

STATEMENT OF GOVERNMENT INTEREST

The present invention was made with government support under Contract No. 16-C-0356 awarded by a classified customer. The United States Government has certain rights in the invention.

TECHNICAL FIELD

The present invention relates to electronic circuits in general, and in particular to a random access memory having scannable latches.

BACKGROUND

Programmable logic devices (PLD), which include application-specific integrated circuits and field-programmable gate arrays, are integrated circuits having programmable logic cores formed by uncommitted logic modules and routing interconnects that are able to implement a costumed logic design up to the logic capacity of the particular PLD. A PLD may include multiple random access memories (RAMs) that generally come in three different flavors, namely, dynamic random access memory (DRAM), static random access memory (SRAM), and register files. Typically, DRAMs are employed when a larger amount of memory is needed, and register files are employed when only a small amount of memory is required. SRAMs are utilized when the required amount of memory falls somewhere in the middle of the above-mentioned two situations.

Both DRAMs and SRAMs tend to have very small physical size per bit, but require a larger amount of operational overhead that includes hardware components such as refresh circuits, sense amplifier circuits, etc. and software for performing memory tests. On the other hand, register files are usually D-register flip-flops located in a compact, pre-routed block. Thus, register files have a much smaller operational overhead than those of DRAMs and SRAMs, but the size per bit for register files is much greater than those of DRAMs and SRAMs.

The present disclosure relates to the provision of a new type of memory that fills the gap between register files and SRAMs when the memory requirement is too big for register files, but too small for SRAMs from a size and power perspective.

SUMMARY

In accordance with one embodiment of the present disclosure, a scannable-latch random access memory (SLRAM) includes a write port, a read port, and a first and second rows of memory cells located between the write and read ports. The SLRAM also includes a functional data input, a scan data input, a first and second functional data outputs, a scan data output, and a scan enable. The functional data input is connected to a first memory cell in the first row of memory cells and to a first memory cell in the second row of memory cells. The scan data input is connected to the first memory cell in one of the first and second row of memory cells. The first functional data output is connected to a last memory cell in the first row of memory cells. The second functional data output is connected to a last memory cell in the second row of memory cells. The scan data output is connected to the last memory cell in one of the first and second row of memory cells. The scan enable allows data to be output from the scan data output or the first and second functional data outputs.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings, wherein.

DETAILED DESCRIPTION

Figure 1:
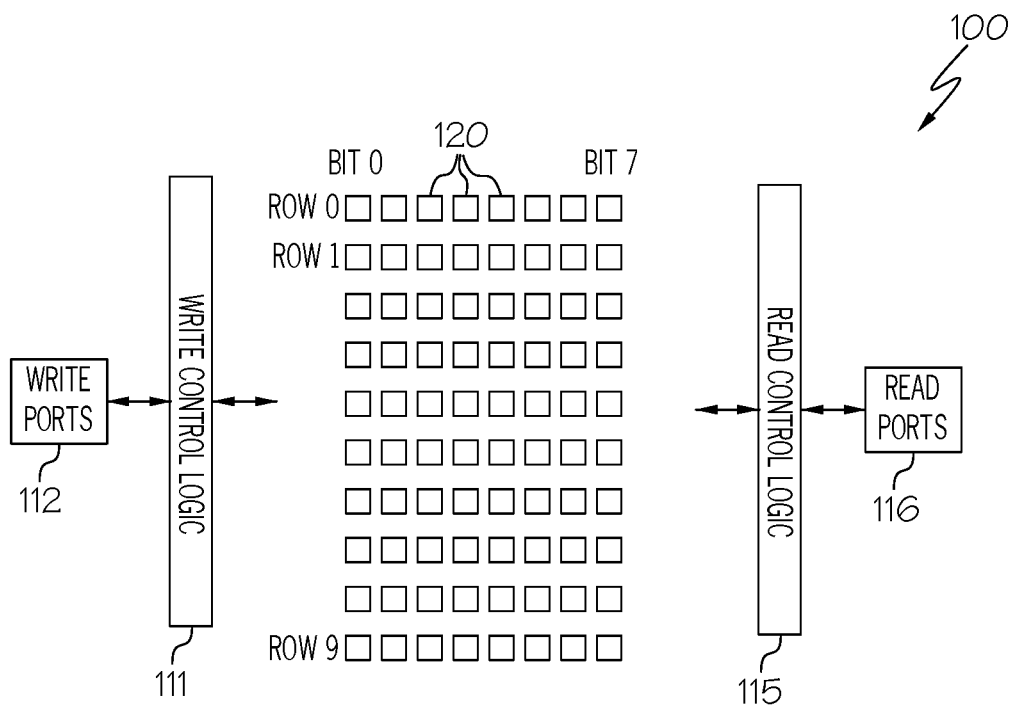
FIG. 1 is a block diagram of a scannable-latch random access memory (SLRAM) design, according to one embodiment.

Referring now to the drawings and in particular to FIG. 1, there is illustrated a block diagram of a scannable-latch random access memory (SLRAM), according to one embodiment. As shown, a SLRAM 100 includes, for example, 80 memory cells 120, each providing one bit of storage. The 80 memory cells 120 are shown to be arranged in a 10-row configuration (i.e., row 0-row 9) with each row having 8 bits; but it is understood by those skilled in the art that SLRAM 100 may include any number of memory cells arranged in any configuration. SLRAM 100 also includes a write control logic circuit 111 and a read control logic circuit 115. Data can be written into SLRAM 100 via write ports 112 that are coupled to write control logic circuit DU 111. Conversely, data can be read from SLRAM 100 via read ports 116 that are coupled to read control logic circuit 115.

Figure 2:
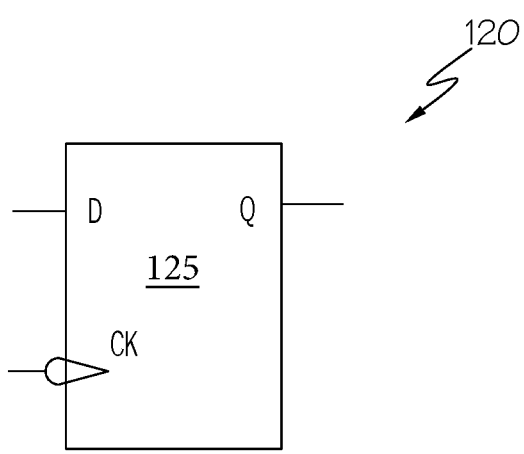
FIG. 2 is a schematic diagram of one memory cell within the SLRAM from FIG. 1, according to one embodiment.

All memory cells 120 within SLRAM 100 are substantially identical to each other. Thus, only one memory cell is further explained in details. With reference now to FIG. 2, there is illustrated a block diagram of one of memory cells 120 within SLRAM 100, according to one embodiment. As shown, memory cell 120 includes a latch 125 having an input D, an output Q, and a clock input CK. Latch 125 is an edge-trigger latch. During the first half of a clock cycle, data is clocked into latch 125 via input D, and during the second half of the same clock cycle, data is clocked out of latch 125 via output Q.

Figure 3:
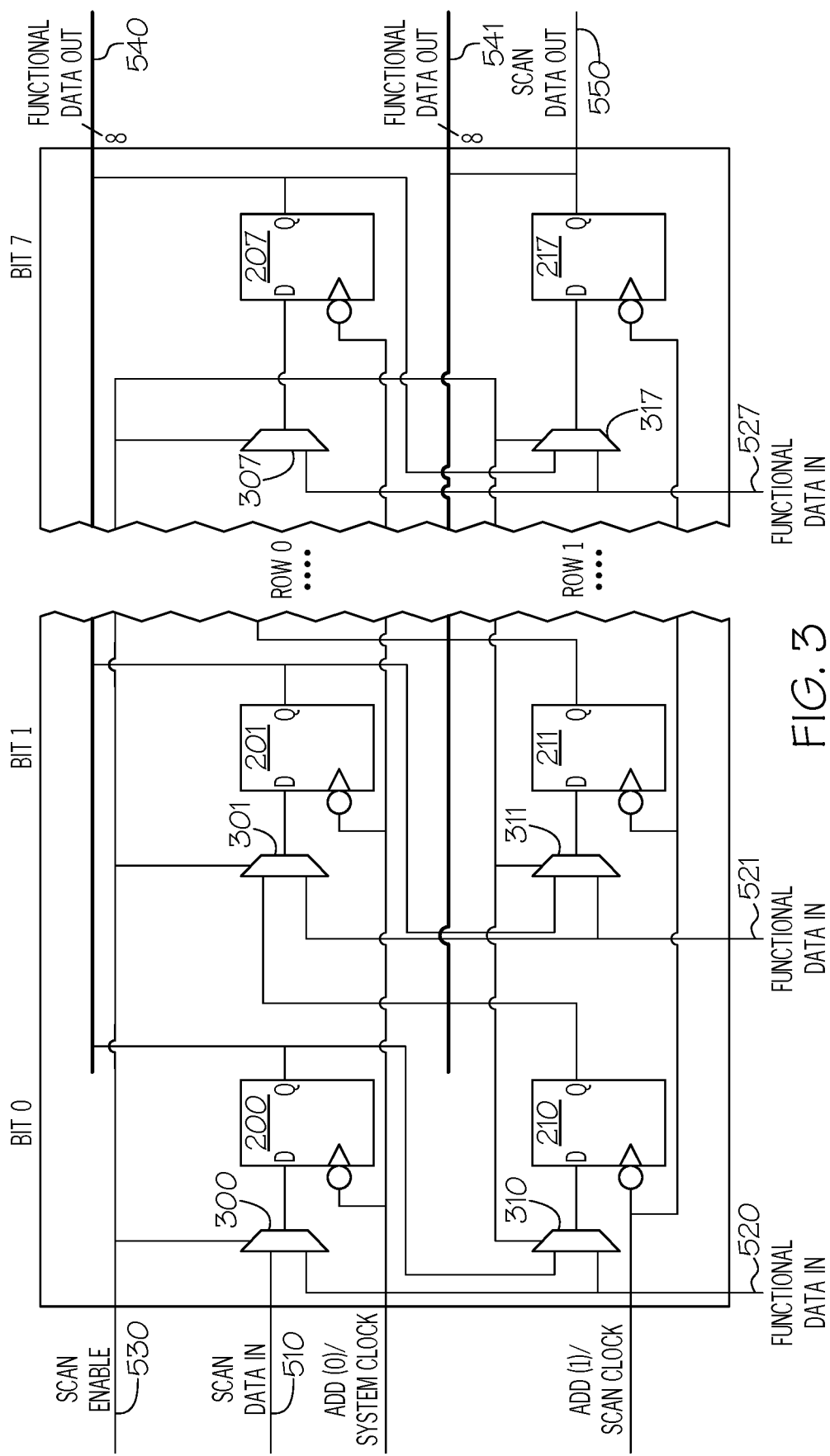
FIG. 3 is a schematic diagram illustrating rows 0 and 1 of the SLRAM from FIG. 1, according to one embodiment.

Referring now to FIG. 3, there is illustrated a detailed block diagram of row 0 and row 1 of SLRAM 100 from FIG. 1, according to one embodiment. As shown, row 0 (or word 0) includes bit 0 having a multiplexor 300 and a latch 200, bit 1 having a multiplexor 301 and a latch 201 up to bit 7 having a multiplexor 307 and latch 207. Similarly, row 1 (or word 1) includes bit 0 having a multiplexor 310 and latch 210, bit 1 having a multiplexor 311 and latch 211 up to bit 7 having a multiplexor 317 and latch 217. Latches 200-207 and latches 210-217 are substantially identical to latch 125 shown in FIG. 2.

By working together, row 0 and row 1 share a scan data input 510, functional data inputs 520-527, and a scan mode enable 530. Specifically, in row 0, multiplexor 300 has its first and second inputs connected to scan data input 510 and functional data input 520, respectively; multiplexor 301 has its first and second inputs connected to an output of latch 200 and functional data input 521, respectively. The outputs of multiplexors 300-307 are connected to the inputs of latches 200-207, respectively. Multiplexors 300-307 are all controlled by scan mode enable 530. The clock inputs of latches 200-207 are connected to an ADD(0)/system clock. Similarly, in row 1, multiplexor 310 has its first and second inputs connected to an output of latch 200 and functional data input 520, respectively; multiplexor 311 has its first and second inputs connected to an output of latch 201 and functional data input 521, respectively. The outputs of multiplexors 300-307 are connected to the inputs of latches 210-211, respectively. Multiplexors 300-307 are all controlled by scan mode enable 531. The clock inputs of latches 210-217 are connected to an ADD(1)/scan clock.

For row 0, the output of latch 200 is connected to a functional data output 540 and to a first input of multiplexor 310, the output of latch 201 is connected to functional data output 540 and to a first input of multiplexor 311, etc. This connection pattern is the same for all remaining latches in row 0, including latch 207 having its output connected to functional data output 540 and to a first input of multiplexor 317. For row 1, the output of latch 210 is connected to a functional data output 541 and to a second input of multiplexor 301, the output of latch 211 is connected to functional data output 541 and to a second input of a multiplexor (not shown) in row 1, etc. This connection pattern is the same for all remaining latches in row 1, except latch 217 having its output connected to functional data output 541 and scan data output 550.

With the above-mentioned configuration, when the number of memory cells in the first and second rows are an even number, scan data input 510 is connected to latch 200 in the first row, and scan data output 550 is connected to latch 217 in the second row. But when the number of memory cells in the first and second rows are an odd number, scan data input 510 is connected to latch 200 in the first row, and scan data output 550 is connected to latch 207 in the first row.

SLRAM 100 includes two modes of operation, namely, a functional mode and a scan mode. SLRAM 100 can be placed in functional mode by turning off scan mode enable 530. When scan mode enable 530 is off, data at functional data inputs 520-527 are allowed to enter multiplexors 300-307 and 310-317, while ADD(0) clock signals and ADD(1) clock signals are utilized to clock latches 200-207 and latches 210-217, respectively. SLRAM 100 can also be placed in scan mode by turning on scan mode enable 530. When scan mode enable 530 is on, a scan data string at scan data input 510 is allowed to enter multiplexors 300 initially, while system clock signals and scan clock signals are utilized to clock latches 200-207 and latches 210-217, respectively.

When SLRAM 100 is in functional mode, SLRAM 100 provides memory operations similar to a typical random access memory. During functional mode, data words can be fed into latches 200-207 and latches 210-217 via respective functional data inputs 520-527. In addition, data words can be read out from latches 200-207 and latches 210-217 via functional data outputs 540 and 541, respectively.

When SLRAM 100 is in scan mode, SLRAM 100 is able to provide scan operations.

A scan operation is a manufacturing test mode. During scan mode, a data string can be fed into latch 200 via scan data input 510. The data string travels from latch 200 to latch 210 in the first clock cycle, from latch 210 to latch 201 in the second clock cycle, from latch 201 to latch 211 in the third clock cycle, and subsequently reaches latch 207 in the eighth clock cycle, and from latch 207 to latch 217 in the ninth clock cycle. Data can be read out from latch 217 at scan data output 540.

Figure 4:
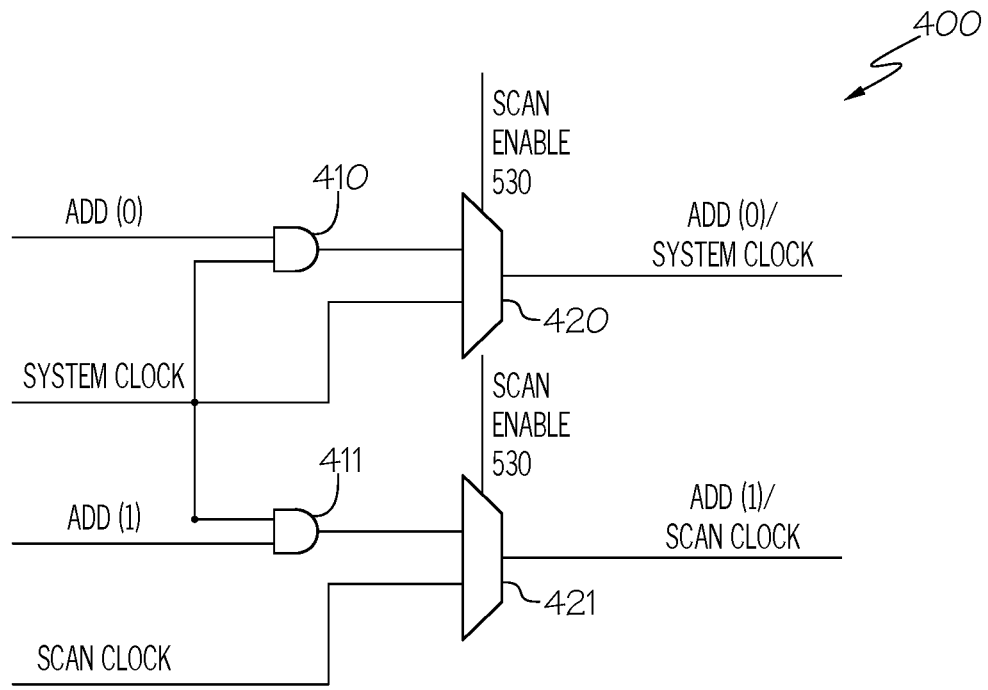
FIG. 4 is a schematic diagram of a clock generator for the SLRAM from FIG. 1, according to one embodiment.

With reference now to FIG. 4, there is depicted a schematic diagram of a clock generator for generating the ADD(0)/system clock signals and the ADD(1)/scan clock signals, according to one embodiment. As shown, a clock generator 400 includes AND gates 410-411 and multiplexors 420-421. An address input ADD(0) and a system clock signal are connected to the inputs of AND gate 410. The output of AND gate 410 and the system clock signal are connected to the inputs of multiplexor 420. Similarly, an address input ADD(1) and the system clock signal are connected to the inputs of AND gate 411. The output of AND gate 411 and a scan clock signal are connected to the inputs of multiplexor 421. Both multiplexors 420 and 421 are controlled by scan mode enable 530. When scan mode enable 530 is turned off (i.e., SLRAM 100 is in functional mode), ADD(0) clock signals and ADD(1) clock signals are output from multiplexors 420 and 421, respectively. When scan mode enable 530 is turned on (i.e., SLRAM 100 is in scan mode), system clock signals and scan clock signals are output from multiplexors 420 and 421, respectively.

Figure 5:
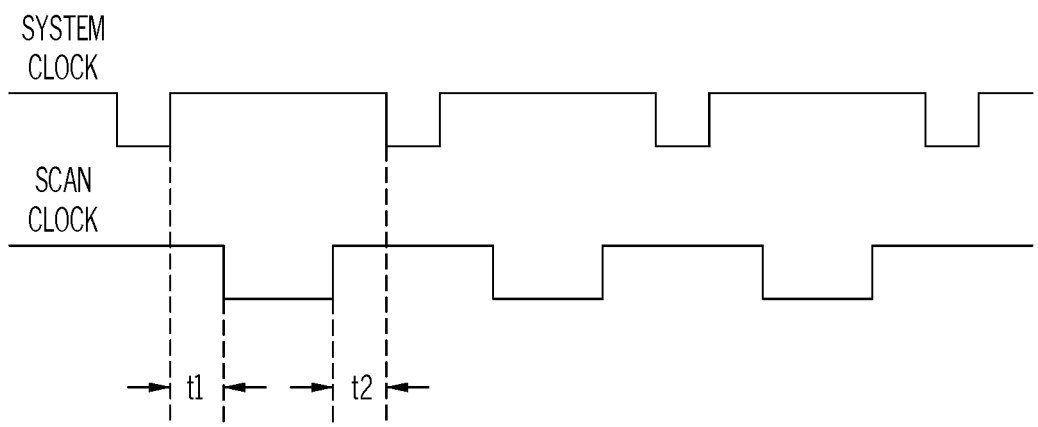
FIG. 5 is a timing diagram illustrating the relationship between a system clock signal and a scan clock signal for the SLRAM from FIG. 1, according to one embodiment.

Referring now to FIG. 5, there is illustrated a timing diagram depicting the relationship between the system clock signal and the scan clock signal. Basically, when the system clock signals are high, the scan clock signals are low. In addition, there is a time lag t1 between the rising edge of the system clock signal and the falling edge of the scan clock signal, and there is a time lag t2 between the rising edge of the scan clock signal and the falling edge of the system clock signal. The time lags t1 and t2 allow scan data to travel through each of latches 200-217 per clock cycle. A conventional D flip-flop includes two transparent latches. A transparent latch latches in and holds data within the latch when a clock signal is low, and then passes data to an output when the clock signal is high. Unlike a conventional D flip-flop that utilizes two bits per latch, SLRAM 100 utilizes one bit per latch.

Although only row 0 and row 1 are utilized to illustrate the functions of SLRAM 100, it is understood by those skilled in the art that the working relationship between row 0 and row 1 are also applicable to rows 2-3, rows 4-5, rows 6-7 and rows 8-9 of SLRAM 100.

As has been described, the present disclosure provides a SLRAM. The SLRAM includes a group of specialized built-in test blocks that do not have any scan capability. Scan capability allows the SLRAM to be tested as though the SLRAM is a D flip-flop. The SLRAM can be configured in scan mode to provide D scannable register to allow standard Automatic Test Pattern Generation (ATPG) tools to test the SLRAM for manufacturing.

While the invention has been particularly shown and described with reference to a preferred embodiment, it will be understood by those skilled in the art that various changes in form and detail may be made therein without departing from the spirit and scope of the invention.

What is claimed:

1. A scannable-latch random access memory (SLRAM) comprising:
   a write port and a read port;
   a first and second rows of memory cells located between said write port and said read port;
   a functional data input connected to a first memory cell in said first row of memory cells and to a first memory cell in said second row of memory cells;
   a scan data input connected to said first memory cell in said first row of memory cells via a first multiplexor, wherein an output of said first memory cell in said first row of memory cells is connected to an input of said first memory cell in said second row of memory cells via a second multiplexor;
   a first functional data output connected to a last memory cell in said first row of memory cells;
   a second functional data output connected to a last memory cell in said second row of memory cells;
   a scan data output connected to said last memory cell in one of said first and second row of memory cells; and
   a scan enable to allow data to be output from one of said scan data output and said first and second functional data outputs.

2. The SLRAM of claim 1, wherein when the number of memory cells in said first row is an even number, then said scan data input is connected to said first memory cell in said first row of memory cells, and said scan data output is connected to said last memory cell in said second row of memory cells.

3. The SLRAM of claim 1, wherein when the number of memory cells in said first row is an odd number, then said scan data input is connected to said first memory cell in said first row of memory cells, and said scan data output is connected to said last memory cell in said first row of memory cells.

4. The SLRAM of claim 1, wherein one of said memory cells includes an edge-triggered latch.

5. The SLRAM of claim 4, wherein said one memory cell is said first memory cell in said first row with said first multiplexor having its inputs connected to said functional data input and said scan data input.

6. The SLRAM of claim 1, wherein said functional data input is connected to said first memory cell in said first row of memory cells via said first multiplexor.

7. The SLRAM of claim 1, wherein said functional data input is connected to said first memory cell in said second row of memory cells via said second multiplexor.

8. The SLRAM of claim 1, further comprising a clock generator to provide one of system clock signals and scan clock signals.

9. The SLRAM of claim 8, wherein said system clock signals are out-of-phase from said scan clock signals.

10. The SLRAM of claim 9, wherein a time lag t1 exists between a rising edge of said system clock signals and a falling edge of said scan clock signals, and a time lag t2 exists between a rising edge of said scan clock signals and a falling edge of said system clock signals.

* * * * *